United States Patent
Xiang

(10) Patent No.: US 7,217,608 B1
(45) Date of Patent: May 15, 2007

(54) CMOS WITH STRAINED SILICON CHANNEL NMOS AND SILICON GERMANIUM CHANNEL PMOS

(75) Inventor: Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 280 days.

(21) Appl. No.: 10/620,605

(22) Filed: Jul. 17, 2003

Related U.S. Application Data

(62) Division of application No. 10/015,808, filed on Dec. 17, 2001, now Pat. No. 6,600,170.

(51) Int. Cl.
*H01L 21/8238* (2006.01)

(52) U.S. Cl. .......................... 438/199; 438/221; 438/763

(58) Field of Classification Search ................ 438/221, 438/218, 199, 763, 154; 257/19, 18, 190, 257/142, 369, 351
See application file for complete search history.

(56) References Cited

U.S. PATENT DOCUMENTS

| | | | |
|---|---|---|---|
| 5,759,898 A | 6/1998 | Ek et al. | |
| 5,998,807 A * | 12/1999 | Lustig et al. | 257/66 |
| 6,039,803 A | 3/2000 | Fitzgerald et al. | |
| 6,180,490 B1 | 1/2001 | Vassiliev et al. | |
| 6,207,530 B1 | 3/2001 | Hsu et al. | |
| 6,214,653 B1 | 4/2001 | Chen et al. | |
| 6,251,751 B1 | 6/2001 | Chu et al. | |
| 6,300,172 B1 | 10/2001 | Ang et al. | |
| 6,313,486 B1 | 11/2001 | Kencke et al. | |
| 6,407,406 B1 | 6/2002 | Tezuka | |
| 6,600,170 B1 * | 7/2003 | Xiang | 257/18 |
| 6,703,271 B2 * | 3/2004 | Yeo et al. | 438/221 |
| 6,724,008 B2 * | 4/2004 | Fitzergald | 257/19 |
| 6,734,527 B1 * | 5/2004 | Xiang | 257/616 |
| 6,900,094 B2 * | 5/2005 | Hammond et al. | 438/238 |
| 2001/0003269 A1 | 6/2001 | Wu et al. | |
| 2001/0008284 A1 | 7/2001 | Huang | |
| 2001/0016383 A1 | 8/2001 | Chen et al. | |
| 2001/0024884 A1 | 9/2001 | Fitzgerald | |
| 2002/0123167 A1 | 9/2002 | Fitzgerald | |

OTHER PUBLICATIONS

Shallow Trench Isolation, "Trench Isolation," http://courses.nus.edu.sg/course/phy/>pp. 1-4.

Hitachi America, Ltd., Semiconductor Equipment Group, "Customizable Shallow Trench Isolation," http://www.hitachi.com/semiequipment/sti.html/>p. 1.

SNP Applications/Shallow Trench Isolation (STI), "Shallow Trench Isolation (STD)," http://www.surfaceinterface.com/snpappsSTI.html/>, pp. 1-2.

(Continued)

*Primary Examiner*—Sara Crane

(57) ABSTRACT

Conventional CMOS devices suffer from imbalance because the mobility of holes in the PMOS transistor is less than the mobility of electrons in the NMOS transistor. The use of strained silicon in the channels of CMOS devices further exacerbates the difference in electron and hole mobility, as strained silicon provides a greater increase in electron mobility than hole mobility. However, hole mobility is increased in the SiGe layer underlying the strained silicon layer. Therefore, a more evenly-balanced, high-speed CMOS device is formed by including strained silicon in the NMOS transistor and not in the PMOS transistor of a CMOS device.

18 Claims, 3 Drawing Sheets

OTHER PUBLICATIONS

Institute of Microelectronics—Deep Submicron—Shallow Trench Isolation, "Shallow Trench Isolation Module Developmetn", http://www.ime.org.sg/deep_trench.htm/>, pp. 1-2.

David Lammers, "MIT spinout preps commercial strained silicon", Oct. 22, 2001, http://www.eetimes.com/story/OEG20011022S0078/>, pp. 1-5.

IBM's Strained Silicon Breakthrough Image Page, Jun. 8, 2001, http://www.research.ibm.com/resources/press/strainedsilicon/>, pp. 1-2.

Dennis Sellers, "It isn't just IBM that has 'strained silicon' technology", Jun. 14, 2001, http://maccentral.macworld.com/news/0106/14.silicon.shtml/>, pp. 1-5.

Matthew French, "Amber Wave Systems 'strained silicon' significant for semiconductor industry", Aug. 6, 2001, http://www.mass.../displaydetail.asp?/>, pp. 1-3.

Richard Ball, "Strained silicon wafers boost FET speed 80 per cent at US start-up", Electronics Weekly Archive, p. 1.

Orla Higgins, Press Release, "Amber Wave Systems Corporation Announces Availability of Breakthrough Strained Silicon Technology", Oct. 22, 2001, pp. 1-4.

Mark A. Wolf, Pres Release, Amberwave Announces Strained Silicon Technology Available Immediately, Jun. 8, 2001, p. 1.

* cited by examiner

CMOS WITH STRAINED SILICON CHANNEL NMOS AND SILICON GERMANIUM CHANNEL PMOS

This application is a divisional of application Ser. No. 10/015,808 filed Dec. 17, 2001, now U.S. Pat. No. 6,600,170.

TECHNICAL FIELD

The present invention relates to the field of manufacturing semiconductor devices, and more particularly, to an improved complementary metal oxide semiconductor field effect transistor (CMOSFET).

BACKGROUND OF THE INVENTION

An important aim of ongoing research in the semiconductor industry is increasing semiconductor performance while decreasing the size of semiconductor devices. Planar transistors, such as metal oxide semiconductor field effect transistors (MOSFET) are particularly well suited for use in high-density integrated circuits. As the size of the MOSFET decreases and the density of the devices increases, the demands of maintaining the electrical isolation of adjacent transistors increases.

The use of shallow trench isolation (STI) significantly shrinks the area needed to isolate transistors and thereby provides higher device density than local oxidation of silicon (LOCOS). STI also provides superior latch-up immunity, smaller channel width encroachment, and improved planarity. The use of STI techniques also eliminates the bird's beak frequently encountered with LOCOS.

Strained silicon technology allows the formation of higher speed devices. Strained-silicon transistors are created by depositing a graded layer of silicon germanium (SiGe) on a bulk silicon wafer. A thin layer of silicon is subsequently deposited on the SiGe layer. The distance between atoms in the SiGe crystal lattice is greater than the distance between atoms in an ordinary silicon lattice. Because there is a natural tendency of atoms inside different crystals to align with one another when a second crystal is formed over a first crystal, when silicon is deposited on top of SiGe the silicon crystal lattice tends to stretch or "strain" to align the silicon atoms with the atoms in the SiGe layer. Electrons in the strained silicon experience less resistance and flow up to 80% faster than in unstrained silicon.

There are two general types of MOS transistors, N-channel MOS (NMOS) formed with n-type source and drain regions in a p-type wafer, and P-channel MOS (PMOS) formed with p-type source and drain regions. NMOS transistors conduct electrons through the transistor channel, while PMOS transistors conduct holes through the transistor channel. Typically, the source and drain regions of the transistors are doped with phosphorous or arsenic to form n-type source/drain regions, while boron doping is used to form p-type source/drain regions.

CMOS transistors, which comprise N- and P-channel MOS transistors on the same substrate, suffer from imbalance. The imbalance is due to electron mobility being greater than hole mobility in the channel region. Therefore, NMOS transistors are faster than PMOS transistors. Typically, NMOS transistors are about 2 to about 2.5 times faster than PMOS transistors.

The problem of imbalance in CMOS devices is further exacerbated in CMOS devices comprising strained silicon channels. Strained silicon does not enhance hole mobility in PMOS transistors as much as it does electron mobility in NMOS transistors. Therefore, a CMOS device comprising strained silicon channels is more unbalanced than a CMOS transistor with conventional crystalline silicon channels.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising a semiconductor.

SUMMARY OF THE INVENTION

There exists a need in the semiconductor device art to provide CMOS transistors, which combine more closely balanced PMOS and NMOS transistors with the increased speed of strained silicon. There exists a need in this art to provide smaller devices. There exists a need in this art to combine higher speed and smaller device-size to provide a more balanced CMOS transistor.

These and other needs are met by embodiments of the present invention, which provide a semiconductor device comprising a semiconductor substrate comprising a silicon germanium (SiGe) layer formed on a base layer. A plurality of field effect transistors (FET) including at least one first FET and at least one second FET are formed on the semiconductor substrate. The first FET comprises a gate electrode formed over the SiGe layer, and a gate oxide layer interposed between the gate electrode and the SiGe layer, wherein the gate oxide layer is formed immediately adjacent to and in contact with the SiGe layer. The second FET comprises a silicon layer formed on the SiGe layer, a gate oxide layer formed on the silicon layer, and a gate electrode formed on the gate oxide layer.

The earlier stated needs are also met by certain embodiments of the instant invention, which provide a method of manufacturing semiconductor devices comprising providing a semiconductor substrate comprising a SiGe layer formed on a base layer and a silicon layer formed on the SiGe layer. The semiconductor substrate comprises first regions and second regions spaced apart from each other by interposed isolation regions. At least a portion of the silicon layer is selectively removed only in the first region. Dopant is implanted in the first and second regions. A gate oxide layer is formed in the first and second regions and a gate electrode layer is formed over the gate oxide layer.

This invention addresses the needs for a higher-speed CMOS device with improved balance between the PMOS transistor and the NMOS transistor. The present invention allows the formation of smaller-sized CMOS transistors with improved performance.

The foregoing and other features, aspects, and advantages of the present invention will become apparent in the following detailed description of the present invention when taken in conjunction with the accompanying drawings.

DETAILED DESCRIPTION OF THE INVENTION

Figure 1:
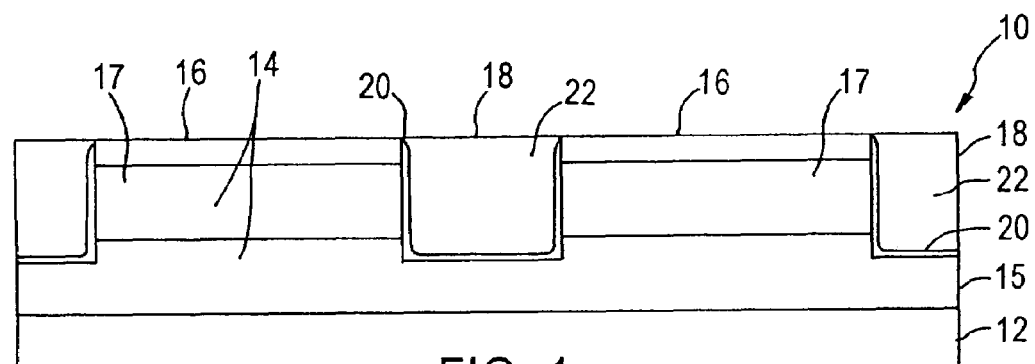
FIGS. 1–6 schematically illustrate the formation of a CMOS device according to one embodiment of the present invention.

The present invention enables the production of improved reduced-size, high-speed semiconductor devices. The present invention combines the enhanced electron mobility through NMOS transistors comprising strained silicon channels with the enhanced mobility of holes through PMOS transistors comprising SiGe channels. These benefits are provided by forming NMOS transistor channels comprising strained silicon and PMOS transistors without strained silicon in the channel region.

The invention will be described in conjunction with the formation of the semiconductor device in the accompanying drawings. However, this is exemplary only as the claimed invention is not limited to the formation of the specific device illustrated in the drawings.

The mobility of holes in a SiGe lattice is greater than the mobility of holes in either strained silicon or conventional silicon crystalline lattices. As discussed above, the mobility of electrons is greater in strained silicon than conventional crystalline silicon. Therefore, forming PMOS transistors with SiGe channels and NMOS transistors with strained silicon channels provides a more balanced CMOS device that operates at higher overall speed than a device in which the PMOS and NMOS channels comprise conventional silicon crystal lattices.

Semiconductor substrate 10, as shown in FIG. 1, comprises a base layer 12, such as a silicon wafer, with a SiGe layer 14 formed thereon. A layer of strained silicon 16 is formed over the SiGe layer 14. The base layer 12 is typically a silicon wafer about 100 µm thick. The SiGe layer 14 is formed by a chemical vapor deposition (CVD) process, such as ultra-high vacuum chemical vapor deposition (UH-VCVD). The SiGe layer 14 comprises a sublayer 15, in which the concentration of Ge is graded from about 0% Ge at the SiGe layer 14/base layer 12 interface. The concentration is increased as the SiGe sublayer 15 is deposited up to a maximum concentration of about 30% Ge. In certain embodiments the maximum concentration of Ge is about 20%. The thickness of the graded sublayer 15 is about 2 µm. When the maximum desired concentration of Ge is achieved, about a 1 µm to 2 µm thick sublayer of SiGe 17, of substantially constant Ge concentration, is deposited over the graded sublayer of SiGe 15 forming a SiGe layer 14 with an overall thickness of about 3 µm to about 4 µm. The concentration of Ge in the constant concentration sublayer 17 is substantially the same as the maximum Ge concentration in the graded sublayer 15.

The strained silicon layer 16 is an epitaxial layer formed by CVD to a thickness of about 50 Å to about 500 Å. In certain embodiments, the silicon layer 16 thickness is about 100 Å to about 300 Å. The atoms in the lattice structure of silicon layer 16 stretch apart from each other in order to align themselves with the underlying lattice structure of the SiGe layer. Electron flow in this "strained silicon" layer 16 is much faster than in ordinary crystalline silicon.

A plurality of isolation regions 18 are formed in the semiconductor substrate 10 in order to electrically isolate a plurality of semiconductor devices formed in the semiconductor substrate 10. The isolation regions 18 illustrated in FIG. 1 are shallow trench isolation (STI) regions formed by anisotropically etching semiconductor substrate 10 to form trenches. A thermal oxide liner layer 20 is grown by conventional methods to a thickness of about 30 Å to about 100 Å, such as by exposing the semiconductor substrate 10 to an oxygen ambient at a temperature about 850° C. to about 1150° C. The trenches are subsequently filled with an insulating material 22, such as silicon nitride or silicon oxide, by a conventional CVD process to form the isolation region 18. Some of the conventional methods of filling a trench with silicon oxide include a) tetraethylorthosilicate low pressure chemical vapor deposition (TEOS LPCVD), b) non-surface sensitive TEOS-ozone atmospheric pressure or sub-atmospheric chemical vapor deposition (APCVD or SACVD), and c) silane oxidation high-density plasma CVD.

The relatively high aspect ratio of the STI trench raises the concern of incomplete filling or void formation when the trench is filled with insulating material 22. In order to alleviate void formation, the insulating material 22 can be densified by thermally annealing the filled trench at high temperature.

Figure 2:
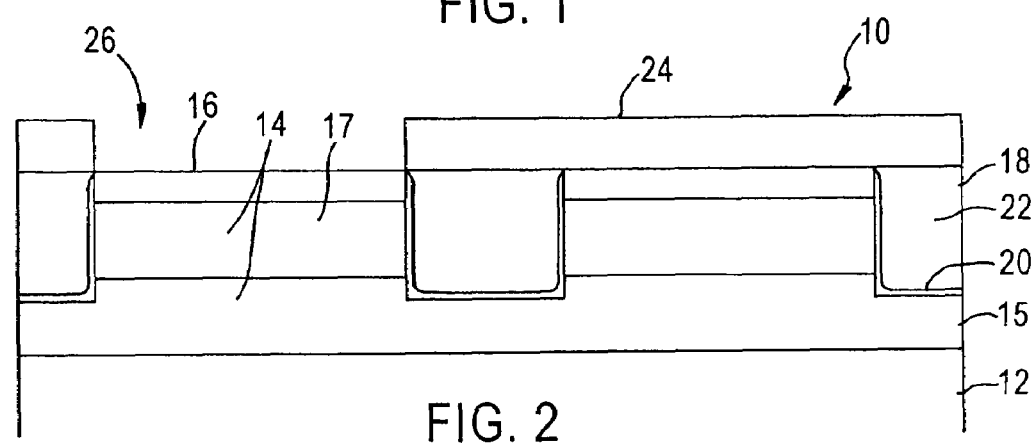
Figure 3:
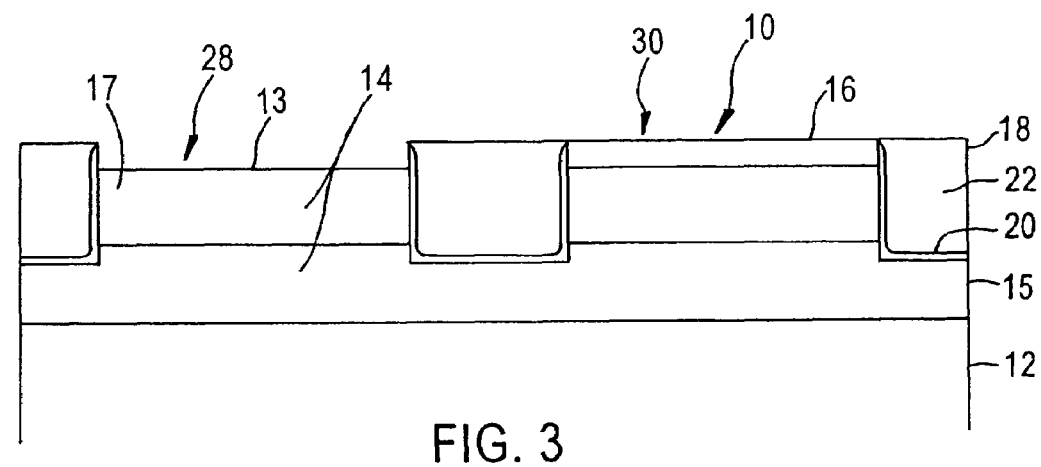

A mask 24 is formed over semiconductor substrate 10 with an opening 26 at the location where the PMOS transistor is to be formed, as shown in FIG. 2. Subsequent to forming the mask 24, the exposed silicon layer 16 is removed, such as by anisotropic etching, and a PMOS channel ion implant is performed. The same mask 24 used for etching the exposed silicon layer 16 is also used during the PMOS channel ion implant. The PMOS channel ion implant is performed through the mask opening 26, either before or after the removal of the exposed silicon layer 16. After removing the strained silicon layer where the PMOS will be formed, two distinct regions are formed, as shown in FIG. 3; a first region 28, in which the surface 13 of the SiGe layer 14 is exposed, and a second region 30, in which the strained silicon layer 16 is exposed.

In a step not shown, the mask 24 is removed and another mask is formed with an opening over the second region 30 where the NMOS is to be formed, and a NMOS channel ion implant is performed while the first region 28 is masked. However, in this step, the strained silicon layer 16 is not etched in the second region 30.

In certain embodiments of the instant invention, a mask is first formed with an opening over the region where the NMOS is to be formed, a NMOS channel implant is performed, and the mask is removed. Following the NMOS channel implant, a second mask is formed with an opening over the region where the PMOS is to be formed, and then the strained silicon layer removal and the PMOS channel implant is performed.

Figure 4:
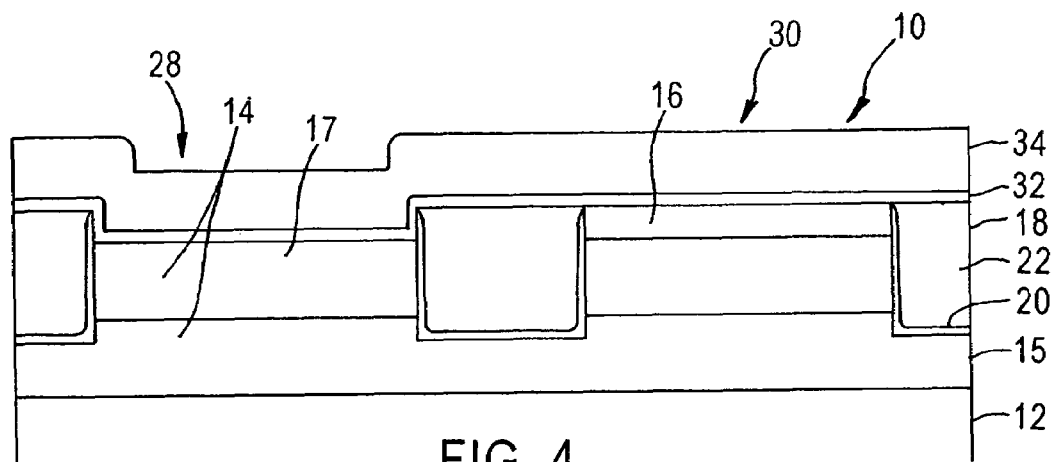

After performing channel implantation in the first and second regions 28, 30, the transistor gates are formed. A gate oxide layer 32 and a gate electrode layer 34 are formed on semiconductor substrate 10, as shown in FIG. 4. The gate oxide layer 32 is formed to a thickness of about 10 Å to about 100 Å, by either CVD or thermal oxidation. In certain embodiments, the gate oxide layer is formed to a thickness of about 10 Å to about 50 Å. The gate oxide layer 32 can be a deposited silicon oxide or a high-k dielectric, such as zirconium dioxide, hafnium dioxide, or stacked nitride dielectric. The gate electrode layer 34 is formed by depositing polysilicon to a thickness of about 50 nm to about 500 nm. In certain embodiments, the gate electrode layer thickness is about 100 nm to about 300 nm.

Figure 5:
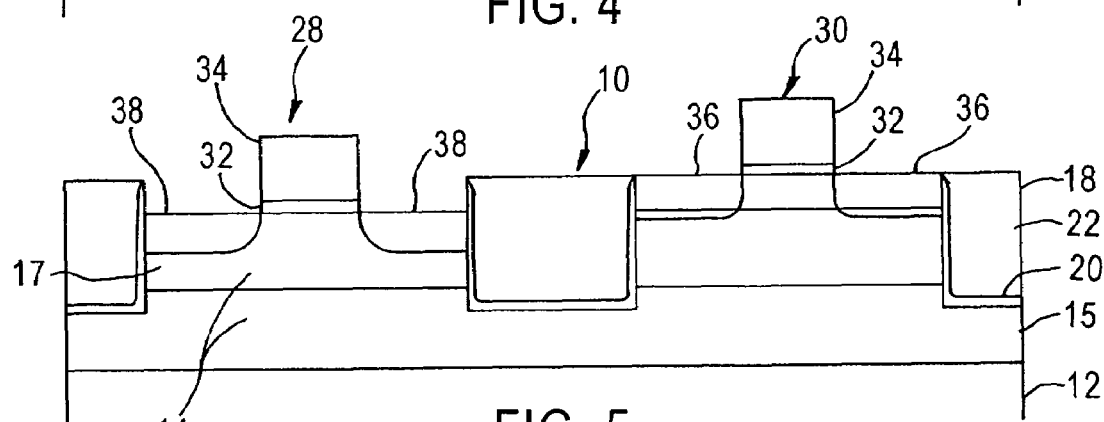

A patterned mask is formed over the structure of FIG. 4, such as by photolithographic patterning, the gate oxide layer 32 and the gate electrode layer 34 are etched to form gate electrode structures, and ion implantation is performed to form source/drain extensions 36, 38, as shown in FIG. 5. Separate masking and ion implantation steps are carried out in order to form source/drain extensions in the first region 28 and the second region 30 because different types of ions are implanted in each region. For example, the second region 30 is masked while ions are implanted in the first region 28, and conversely, the first region 28 is masked while ions are implanted in the second region 30. As shown in FIG. 5, source/drain extensions 38 are formed in the first region 28 and source/drain extensions 36 are formed in the second region 30.

Figure 6:
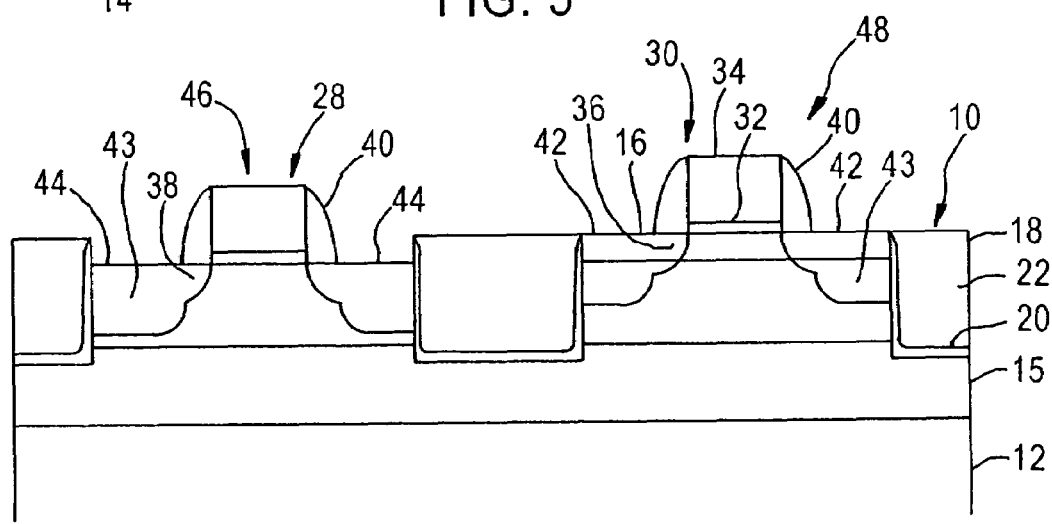

Sidewall spacers 40, as shown in FIG. 6, are subsequently formed on the semiconductor substrate 10 by depositing a layer of insulating material, such as silicon nitride or silicon oxide followed by anisotropic etching to form sidewall spacers 40. PMOS source/drain regions 44 and NMOS source/drain regions 42 are subsequently formed by conventional ion implantation techniques, followed by annealing to form the respective p-type and n-type source/drain regions 44, 42 comprising the respective lightly doped drain extensions 38, 36 and heavily doped regions 45, 43. Separate masking and ion implantation steps are carried out in order to form the heavily doped regions 45, 43 of the source/drain regions 44, 42 in the first region 28 and the second region 30 because different types of ions are implanted in each region. As shown in FIG. 6, the resulting structure is a CMOS device with PMOS 46 and NMOS 48 transistors, wherein the channel region of the PMOS comprises the SiGe layer 14 and the channel region of NMOS 48 comprises the strained silicon layer 16 and the SiGe layer 14.

Figure 7:
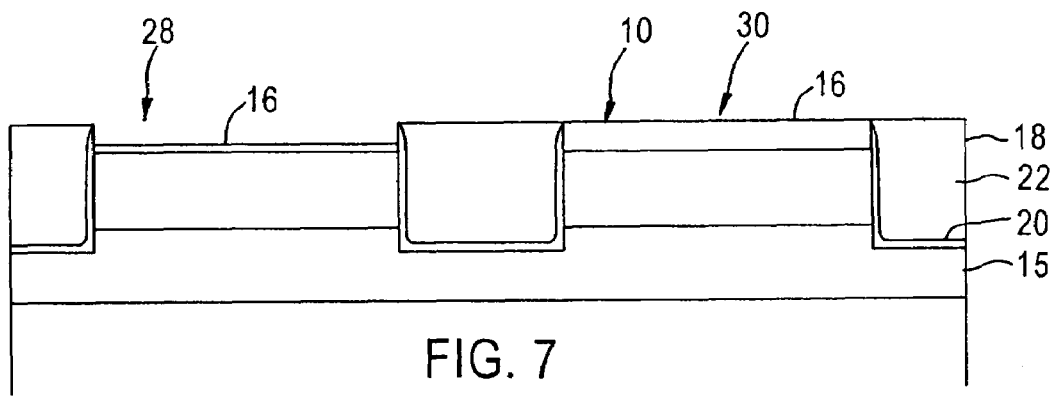
FIGS. 7–8 schematically illustrate an alternative method of forming the gate oxide layer according to the present invention.
Figure 8:
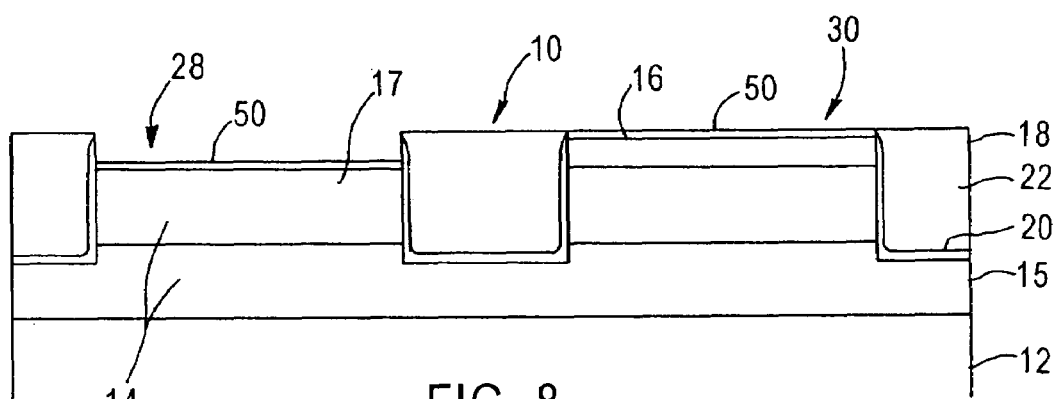

In an alternative embodiment of forming the CMOS of the present invention, the silicon layer 16 is only partially removed in the first region 28. As shown in FIG. 7, the silicon layer 16 in first region 28 is not completely removed, rather it is etched down to a thickness of about 5 Å to about 25 Å by anisotropic etching. A gate oxide layer 50 is formed over the first and second regions 28, 30 by thermally oxidizing the strained silicon layer 16. The thermal oxidation substantially completely oxidizes the silicon layer 16 remaining in the first portion 28, while only partially oxidizing silicon layer 16 in second region 30. To provide a gate oxide layer 50 of about 10 Å thickness, a silicon layer thickness of about 5 Å is required in first region 28 before thermal oxidation. To provide a gate oxide layer 50 thickness of about 20 Å, the thickness of the remaining silicon layer in the first region 28 before thermal oxidation needs to be about 10 Å. After forming the thermal gate oxide layer 50 the semiconductor substrate 10 is processed as described above, including the steps of forming a gate electrode layer, masking and etching the gate electrode layer and gate oxide layer, forming sidewall spacers, and ion implantation to form a CMOS device.

Figure 9:
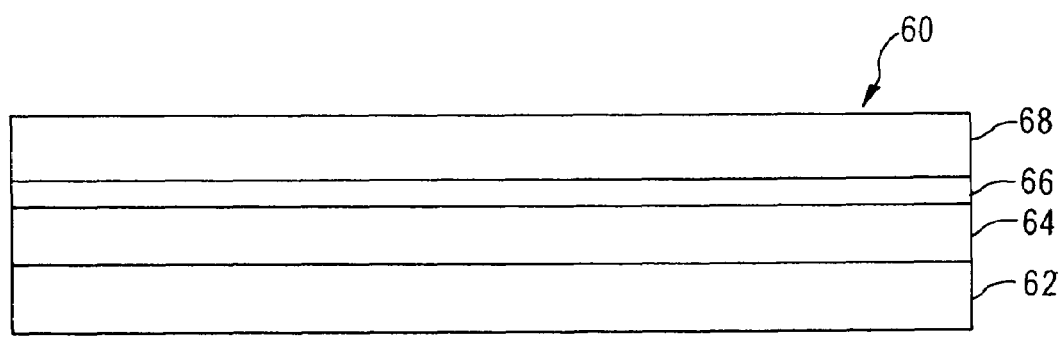
FIG. 9 illustrates the use of a low temperature, bottom anti-reflection coating to preserve the amorphous nature of amorphous polysilicon.

In other aspects, a low temperature plasma enhanced chemical vapor deposition (PECVD) bottom anti-reflection coating (BARC) is spun on an amorphous layer of polysilicon. The use of a low temperature PECVD coating preserves the amorphous nature of the polysilicon layer, which helps maintain a smooth polysilicon line edge. Conventional BARC layers deposited at high temperature causes crystallization of the amorphous polysilicon, which results in rough polysilicon line edges. FIG. 9 illustrates a semiconductor substrate 60 comprising a low temperature BARC 66 formed on an amorphous polysilicon layer 64 on a silicon base layer 62, with a resist layer 68 overlying the BARC 66.

The CMOS device of the present invention is a reduced dimension, high-speed, more balanced CMOS device than CMOS devices formed on conventional crystalline silicon lattices. The methods of the present invention combine the enhanced mobility of holes in SiGe lattices and the enhanced mobility of electrons in strained silicon lattices to produce a higher-speed, more-balanced CMOS device.

The embodiments demonstrated in the instant disclosure are for illustrative purposes only. It should not be construed to limit the scope of the claims. As is clear to one of ordinary skill in the art, the instant disclosure encompasses a wide variety of embodiments not specifically illustrated herein.

What is claimed is:

1. A method of manufacturing semiconductor devices, the method comprising:
   providing a semiconductor substrate comprising a SiGe layer formed on a base layer, and a silicon layer formed on the SiGe layer, wherein the semiconductor substrate comprises one or more first regions and one or more second regions spaced apart from each other by isolation regions between the first regions and the second regions;
   selectively removing at least a portion of the silicon layer only in said one or more first regions;
   implanting a p-type dopant in said one or more first regions after said selectively removing at least a portion of the silicon layer and implanting an n-type dopant in said one or more second regions;
   forming a gate oxide layer in said one or more first regions and said one or more second regions; and
   forming a gate electrode layer over the gate oxide layer.

2. The method according to claim 1, wherein substantially all of the silicon layer is removed from said one or more first regions.

3. A method of manufacturing semiconductor devices, the method comprising:
   providing a semiconductor substrate comprising a SiGe layer formed on a base layer, and a silicon layer formed on the SiGe layer, wherein the semiconductor substrate comprises one or more first regions and one or more second regions spaced apart from each other by isolation regions between the first regions and the second regions;
   selectively removing at least a portion of the silicon layer only in said one or more first regions;
   implanting a p-type dopant in said one or more first regions and implanting an n-type dopant in said one or more second regions;
   forming a gate oxide layer in said one or more first regions and said one or more second regions; and
   forming a gate electrode layer over the gate oxide layer, wherein
   said gate oxide layer is a high-k dielectric layer formed on the SiGe layer of said one or more first regions after removing substantially all of the silicon layer.

4. The method according to claim 3, wherein the high-k dielectric layer comprises dielectric selected from the group consisting of zirconium oxide or hafnium oxide.

5. A method of manufacturing semiconductor devices, the method comprising:
   providing a semiconductor substrate comprising a SiGe layer formed on a base layer, and a silicon layer formed on the SiGe layer, wherein the semiconductor substrate comprises one or more first regions and one or more second regions spaced apart from each other by isolation regions between the first regions and the second regions;
   selectively removing at least a portion of the silicon layer only in said one or more first regions;
   implanting a p-type dopant in said one or more first regions and implanting an n-type dopant in said one or more second regions;
   forming a gate oxide layer in said one or more first regions and said one or more second regions;

forming a gate electrode layer over the gate oxide layer, wherein the silicon layer is oxidized to form the gate oxide layer.

6. The method according to claim 5, wherein substantially all of the remaining silicon layer in said one or more first regions is oxidized to form the gate oxide layer.

7. The method according to claim 1, wherein the silicon layer is formed to a thickness of about 50 Å to about 500 Å.

8. The method according to claim 1, wherein the gate oxide layer has a thickness of about 10 Å to about 50 Å.

9. The method according to claim 1, wherein the silicon layer comprises strained silicon.

10. A method of manufacturing semiconductor devices, the method comprising:

providing a semiconductor substrate comprising a SiGe layer formed on a base layer, and a silicon layer formed on the SiGe layer, wherein the semiconductor substrate comprises one or more first regions and one or more second regions spaced apart from each other by isolation regions between the first regions and the second regions;

selectively removing at least a portion of the silicon layer only in said one or more first regions;

implanting a p-type dopant in said one or more first regions and implanting an n-type dopant in said one or more second regions;

forming a gate oxide layer in said one or more first regions and said one or more second regions; and forming a gate electrode layer over the gate oxide layer, wherein the SiGe layer comprises a first sublayer and said first sublayer has a composition that is graded from about 0% Ge at the SiGe layer/base layer interface up to about 30% Ge.

11. A method of manufacturing semiconductor devices, the method comprising:

providing a semiconductor substrate comprising a SiGe layer formed on a base layer, and a silicon layer formed on the SiGe layer, wherein the semiconductor substrate comprises one or more first regions and one or more second regions spaced apart from each other by isolation regions between the first regions and the second regions;

selectively removing at least a portion of the silicon layer only in said one or more first regions;

implanting dopant in said one or more first regions and said one or more second regions; and forming a gate oxide layer in said one or more first regions and said one or more second regions by oxidizing the silicon layer to form the gate oxide layer, wherein substantially all of the remaining silicon layer in said one or more first regions is oxidized to form the gate oxide layer.

12. The method according to claim 11, wherein a p-type dopant is implanted in said one or more first regions and an n-type dopant is implanted in said one or more second regions.

13. The method according to claim 11, wherein the SiGe layer comprises a first sublayer and said first sublayer has a composition that is graded from about 0% Ge at the SiGe layer/base layer interface up to about 30% Ge.

14. A method of manufacturing semiconductor devices, the method comprising:

providing a semiconductor substrate comprising a SiGe layer formed on a base layer, and a silicon layer formed on the SiGe layer, wherein the semiconductor substrate comprises one or more first regions and one or more second regions spaced apart from each other by isolation regions between the first regions and the second regions;

selectively removing substantially all of the silicon layer only in said one or more first regions;

implanting dopant in said one or more first regions and said one or more second regions;

forming a gate oxide layer in said one or more first regions and said one or more second regions, wherein said gate oxide layer is formed immediately adjacent to and in contact with the SiGe layer in said one or more first regions.

15. The method according to claim 14, wherein a p-type dopant is implanted in said one or more first regions and an n-type dopant is implanted in said one or more second regions.

16. The method according to claim 14, wherein said gate oxide layer is a high-k dielectric layer formed on the SiGe layer of said one or more first regions after removing substantially all of the silicon layer.

17. The method according to claim 16, wherein the high-k dielectric layer comprises dielectric selected from the group consisting of zirconium oxide or hafnium oxide.

18. The method according to claim 14, wherein the SiGe layer comprises a first sublayer and said first sublayer has a composition that is graded from about 0% Ge at the SiGe layer/base layer interface up to about 30% Ge.

* * * * *